(12) United States Patent
Hu et al.

(10) Patent No.: US 9,612,356 B2
(45) Date of Patent: Apr. 4, 2017

(54) LOW-TEMPERATURE SUPERCONDUCTING DEVICE FOR MEASURING GRAVITY

(71) Applicant: Institute of Electrical Engineering, Chinese Academy of Sciences, Beijing (CN)

(72) Inventors: Xinning Hu, Beijing (CN); Qiuliang Wang, Beijing (CN); Chunyan Cui, Beijing (CN); Hui Wang, Beijing (CN); Yinming Dai, Beijing (CN)

(73) Assignee: Institute of Electrical Engineering, Chinese Academy of Sciences, Beijing (CN)

( * ) Notice: Subject to any disclaimer, the term of this patent is extended or adjusted under 35 U.S.C. 154(b) by 266 days.

(21) Appl. No.: 14/427,829

(22) PCT Filed: Aug. 19, 2013

(86) PCT No.: PCT/CN2013/081714
§ 371 (c)(1),
(2) Date: Mar. 12, 2015

(87) PCT Pub. No.: WO2014/040474
PCT Pub. Date: Mar. 20, 2014

(65) Prior Publication Data
US 2015/0247949 A1    Sep. 3, 2015

(30) Foreign Application Priority Data
Sep. 13, 2012    (CN) .......................... 2012 1 0340049

(51) Int. Cl.
*G01V 7/00* (2006.01)
*G01V 7/02* (2006.01)
*G01R 33/12* (2006.01)

(52) U.S. Cl.
CPC .......... *G01V 7/02* (2013.01); *G01R 33/1238* (2013.01); *G01R 33/1261* (2013.01); *G01V 7/00* (2013.01)

(58) Field of Classification Search
CPC ... G01V 7/00; G01V 7/02; G01V 7/04; G01R 33/1238; G01R 33/1261
(Continued)

(56) References Cited

U.S. PATENT DOCUMENTS

| 4,841,772 A * | 6/1989 | Paik .................. G01V 7/00 73/382 G |
| 5,117,139 A * | 5/1992 | Flom .................. F16C 32/0438 310/90.5 |

(Continued)

FOREIGN PATENT DOCUMENTS

| CN | 1166877 A | 12/1997 |
| CN | 2419607 Y | 2/2001 |

(Continued)

*Primary Examiner* — Benjamin Schmitt
(74) *Attorney, Agent, or Firm* — The Webb Law Firm

(57) ABSTRACT

A low-temperature superconducting device for measuring gravity, includes a low-temperature container, a cryocooler, a rotor chamber, a superconducting rotor, an upper levitation coil, a lower levitation coil, an upper electrode, an intermediate electrode, a lower electrode, a magnetic shielding chamber and a superconducting quantum interference device. By cooling the whole low-temperature superconducting device using a cryocooler, the intermediate electrode disposed in the body of the magnetic shielding chamber will generate an output voltage when the superconducting rotor is displaced due to a change of gravity. Thus, the superconducting quantum interference device can make the superconducting rotor return to the central balance position by adjusting the operating current of the upper levitation coil or the lower levitation coil. A change of gravity can be deter- (Continued)

mined based on the operating current fed back to the upper levitation coil or the lower levitation coil.

8 Claims, 3 Drawing Sheets

(58) Field of Classification Search
USPC .............................................. 73/382 R, 383
See application file for complete search history.

(56) References Cited

U.S. PATENT DOCUMENTS

| | | |
|---|---|---|
| 5,204,568 A | 4/1993 | Kleinberg et al. |
| 5,587,526 A * | 12/1996 | Lumley .................. G01P 15/11 |
| | | 73/382 G |
| 5,962,781 A | 10/1999 | Veryaskin |
| 6,871,542 B2 | 3/2005 | Veryaskin |
| 2013/0285624 A1* | 10/2013 | Hu ......................... H02N 15/00 |
| | | 322/58 |

FOREIGN PATENT DOCUMENTS

| | | |
|---|---|---|
| CN | 1561455 A | 1/2005 |
| CN | 101082678 A | 12/2007 |
| CN | 101113896 A | 1/2008 |
| CN | 102305872 A | 1/2012 |
| CN | 102494679 A | 6/2012 |
| CN | 102545725 A | 7/2012 |
| CN | 102608668 A | 7/2012 |
| CN | 102866431 A | 1/2013 |

* cited by examiner

LOW-TEMPERATURE SUPERCONDUCTING DEVICE FOR MEASURING GRAVITY

CROSS-REFERENCE TO RELATED APPLICATIONS

This application is the United States national phase of International Application No. PCT/CN2013/081714 filed August 19, 2013, and claims priority to Chinese Patent Application No. 201210340049.2 filed September 13, 2012, the disclosures of which are hereby incorporated in their entirety by reference.

TECHNICAL FIELD

This disclosure relates to the field of measuring gravity, and more particularly to a low-temperature superconducting device for measuring gravity.

DESCRIPTION OF THE RELATED ART

Gravimeter is usually used to indirectly measure a change of gravity by measuring tiny displacement of an object. In conventional way, a deformation quantity of a mechanical spring is measured to measure a variation of gravity. Due to the spring creeping and zero drifting, measuring accuracy is not high enough. With the development of science and technology, gravimeters based on quartz resonance, liquid-floatation, air-floatation, and magnetic suspension have been emerged. These types of gravimeters have a precision up to the scale of microgal. Gravity measurement may be used for providing some parameters on predicting disastrous weather events, such as earthquakes, hurricanes and so on, for prospecting mineral and geothermal resource, and for researching the effect of celestial motion on the earth gravity field.

With the continuous development of superconducting materials and low-temperature technology, the application of superconducting technology in various domains has been found wider and wider, the demands of China's industrial modernization are increasingly satisfied, and the performance and accuracy of various equipments are greatly improved. Low-temperature superconducting devices are critical to realize low-temperature superconducting environments. The design and performance of low-temperature superconducting devices is the basis of researching and improving superconducting instruments and equipments, and thus has great significance. The developments of cryocoolers and conduction cooling technology provide more options on the structural design and applications of low-temperature superconducting devices. Currently, the secondary coldhead of a cryocooler is able to reach a temperature below 4K. The superconducting temperature range may be substantially divided into a high-temperature superconducting range and a low-temperature superconducting range. In general, the temperature range in which superconductivity is achieved below a temperature of 10K is referred to as the low-temperature superconducting range, and the temperature range in which superconductivity is achieved under a temperature from 10K to 100K is referred to as the high-temperature superconducting range. Low-temperature superconducting devices for measuring gravity designed by taking advantages of low-temperature superconducting magnetic shielding property and zero creeping property of low-temperature superconducting materials have incomparable advantages as compared with other gravity measuring devices. Currently, low-temperature superconducting devices generally adopt liquid helium cooling technique. In the case of only depending on liquid helium cooling, there is a higher design requirement due to heat leakage of low-temperature devices. Further, the operation of repeated liquid transmission process is complicated and it is necessary to supplement liquid helium periodically to maintain a low-temperature environment, causing unguaranteed long term stand-along operation of the devices and high cost thereof. Furthermore, those devices have larger volumes, which is disadvantage for the long term use under various complex field environments.

SUMMARY

An object of this disclosure is to provide a low-temperature superconducting device for measuring gravity. The device is possible to meet the requirements of long term stand-along operation and is suitable for use in various field environments by adopting a cryocooler to solve the problem of periodic supplementation which is brought by liquid helium volatilization.

According to an aspect of the present disclosure, a low-temperature superconducting device for measuring gravity is provided, the device comprising a low-temperature container, a cryocooler, an anti-radiation barrel, a rotor chamber, a superconducting rotor, an upper levitation coil, a lower levitation coil, an upper electrode, an intermediate electrode, a lower electrode, pull rods and a magnetic shielding chamber; wherein the cryocooler is positioned at the upper portion of the low-temperature container, and the anti-radiation barrel with a roller shape is fixed at the lower portion of the primary coldhead of the cryocooler by the pull rods in the internal of the low-temperature container; the rotor chamber is disposed in the anti-radiation barrel and is fixed at the lower portion of the secondary coldhead of the cryocooler; the upper levitation coil is disposed at the upper portion of the rotor chamber, and the lower levitation coil is disposed at the lower portion of the rotor chamber; the magnetic shielding chamber is disposed in the center of the rotor chamber; the superconducting rotor is disposed in the magnetic shielding chamber; the annular intermediate electrode is disposed around the equator position of inner surface of the body of the magnetic shielding chamber; the upper electrode is disposed in the central position of the upper portion of the body of the magnetic shielding chamber and the lower electrode is disposed in the central position of the lower portion of the body of the magnetic shielding chamber; a spherical cavity is formed by the inner-oriented surfaces of the magnetic shielding chamber, the upper electrode, the intermediate electrode and the lower electrode.

Preferably, the upper electrode is disposed on the top of the superconducting rotor, the lower electrode is disposed under the superconducting rotor, and the annular intermediate electrode surrounds the superconducting rotor along the equator thereof; a first capacitor comprises the upper electrode and the intermediate electrode, a second capacitor comprises the lower electrode and the intermediate electrode; the upper electrode, the intermediate electrode and the lower electrode form three electrodes for measuring change of levitation displacement of the superconducting rotor; the output end of the intermediate electrode is connected to two ends of an input coil of a superconducting quantum interference device; the superconducting quantum interference device is disposed on the outer surface of the rotor chamber.

Preferably, in the method for measuring gravity by above device, the superconducting rotor is levitated at a central balance position of the magnetic shielding chamber by levitation forces generated from the provision of electric power to the upper levitation coil and the lower levitation coil, and at this time, the resultant force of above levitation forces applied on the superconducting rotor equals to the gravity of the superconducting rotor; when the superconducting rotor is displaced due to a change of the earth's surface gravity field, a current generated by an output voltage of the intermediate electrode flows through an input coil of the superconducting quantum interference device. The input coil is coupled to a superconducting ring in the superconducting quantum interference device, so that the superconducting quantum interference device generates a corresponding output voltage and provides a feedback current to the upper levitation coil or the lower levitation coil, and a levitation force generated from the feedback current makes the superconducting rotor return to the central balance position; by calibrating the relationship between the feedback current and the levitation force applied on the superconducting rotor, it is possible to obtain the value of the levitation force applied on the superconducting rotor by measuring the feedback current, and a change value of gravity is obtained accordingly.

In the present disclosure, by cooling the whole low-temperature superconducting device using the cryocooler, the intermediate electrode disposed in the body of the magnetic shielding chamber will generate an output voltage when the superconducting rotor is displaced due to a change of gravity, thus, the superconducting quantum interference device can make the superconducting rotor return to the central balance position by adjusting the operating current of the upper levitation coil or the lower levitation coil. That is, a change of gravity can be determined based on the operating current fed back to the upper levitation coil or the lower levitation coil. Thus, unlike the conventional superconducting device for measuring gravity, the superconducting device according to the present disclosure can be operated independently for a long term, and can be used in various field environments.

BRIEF DESCRIPTION OF THE DRAWINGS

The accompanying drawings are included to provide a further understanding and are incorporated in and constitute a part of this specification. It is to be understood that both the foregoing general description and the following Detailed Description are merely exemplary and are intended to provide an overview or framework for understanding the nature and character of the claims, rather than to limit the present disclosure inappropriately, in which:

DETAILED DESCRIPTION

The present disclosure will be further described herein with reference to the drawings and embodiments.

Figure 1:
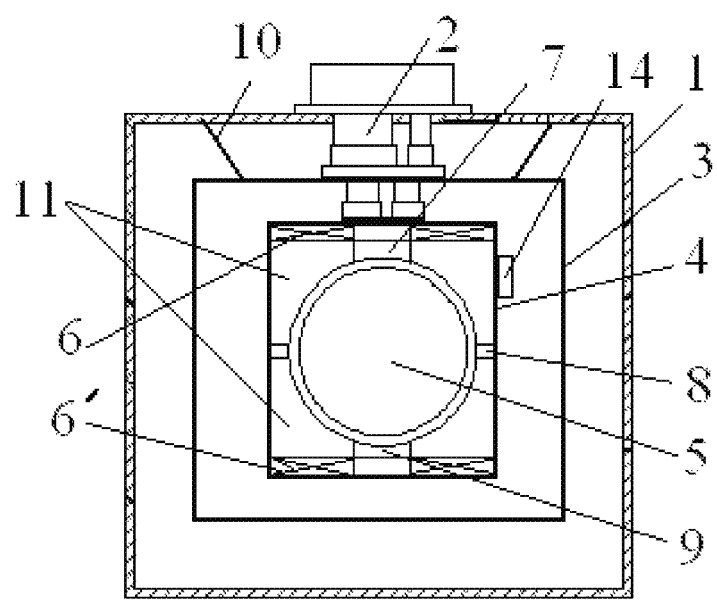
FIG. 1 is a schematic diagram of one embodiment of a low-temperature superconducting device according to the present disclosure.
Figure 2:
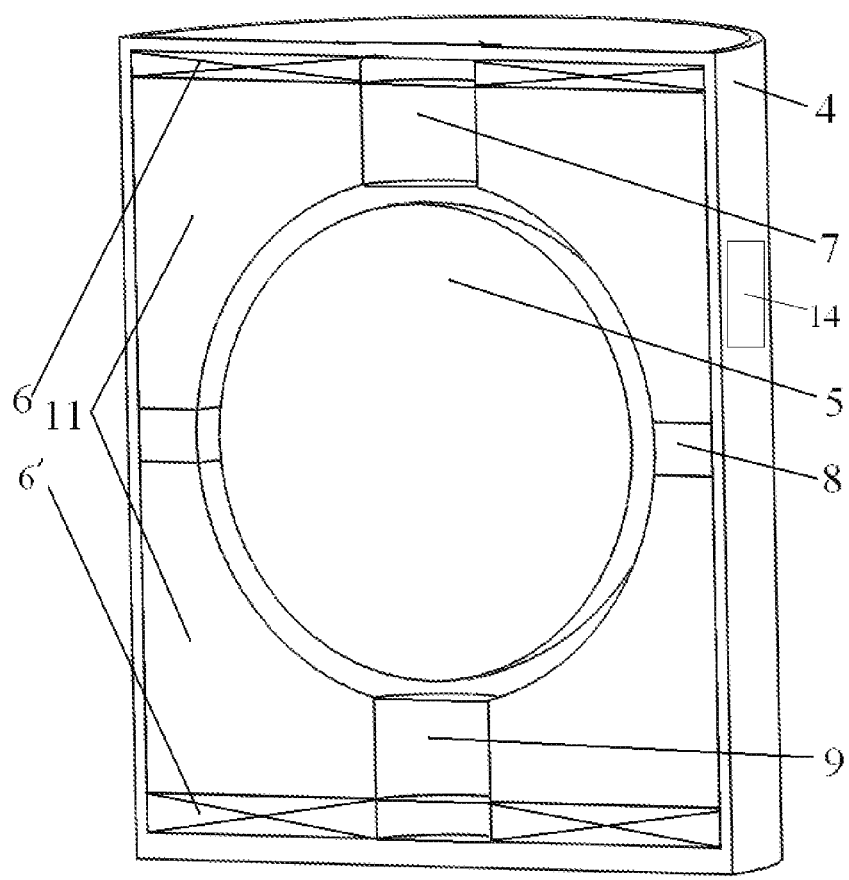
FIG. 2 is a structural diagram of one embodiment of a rotor chamber of the present disclosure.

FIG. 1 is a schematic diagram of an embodiment of the low-temperature superconducting device according to the present disclosure, and FIG. 2 is a structural diagram of an embodiment of the rotor chamber of the present disclosure.

As shown in FIGS. 1 and 2, the low-temperature superconducting device comprises a low-temperature container 1, a cryocooler 2, a rotor chamber 4, a superconducting rotor 5, an upper levitation coil 6, a lower levitation coil 6', an upper electrode 7, an intermediate electrode 8, a lower electrode 9, a magnetic shielding chamber 11 and a superconducting quantum interference device 14, wherein the cryocooler 2 is positioned at the upper portion of the low-temperature container 1, and the rotor chamber 4 disposed in the low-temperature container 1 is fixed at the lower portion of a secondary coldhead of the cryocooler 2.

Wherein, a cooling temperature that the secondary coldhead of the cryocooler 2 can provide is about 4K.

The upper levitation coil 6 is disposed at the upper portion of the rotor chamber 4, and the lower levitation coil 6' is disposed at the lower portion of the rotor chamber 4. The magnetic shielding chamber 11 is disposed in the center of the rotor chamber 4. A spherical cavity is formed in the interior of the magnetic shielding chamber 11.

The superconducting rotor 5 is levitated at a central balance position of the spherical cavity by means of magnetic forces generated by the upper levitation coil 6 and the lower levitation coil 6' according to the Meissner effect.

Wherein, because of being cooled by the cryocooler, the upper levitation coil 6, the lower levitation coil 6', the magnetic shielding chamber 11 and the superconducting rotor 5 are kept in a superconducting state under a low temperature.

Wherein, the gravity of the superconducting rotor 5 and magnetic forces generated by the upper levitation coil 6 and the lower levitation coil 6' are balanced at above central balance position, so that the superconducting rotor 5 is levitated at the central balance position.

The upper electrode 7 is disposed in the central position of the upper portion of the body of the magnetic shielding chamber 11, the lower electrode 9 is disposed in the central position of the lower portion of the body of the magnetic shielding chamber 11, and the annular intermediate electrode 8 is disposed along the sidewall of the body of the magnetic shielding chamber 11, i.e. along the periphery of a horizontal plane passing the centre of the spherical cavity. In other words, the intermediate electrode 8 surrounds the periphery of equator plane of the superconducting rotor 5. The inner-oriented surfaces of the body of the magnetic shielding chamber 11, the upper electrode 7, the intermediate electrode 8 and the lower electrode 9 compose a complete spherical cavity.

Preferably, insulating layers are disposed between the magnetic shielding chamber 11 and each of the upper electrode 7, the intermediate electrode 8 and the lower electrode 9.

Wherein, the spherical cavity may make the directions of all levitation forces applied on the superconducting rotor 5 point to the centre of the spherical cavity, and the resultant force of the levitation forces may be kept in a consistent direction with gravity by means of the symmetric structure of the spherical cavity, thus levitation stability is guaranteed and the difficulty of gravity measurement is reduced.

The superconducting quantum interference device 14 is disposed on the outer sidewall of the rotor chamber 4. Accordingly, it is possible to suppress the effects on measurement accuracy caused by the external interference magnetic field.

When the superconducting rotor 5 deviates from the central balance position, a voltage is outputted from the intermediate electrode 8. According to a current generated from the voltage outputted from the intermediate electrode 8, the superconducting quantum interference device 14 adjusts the operating current of the upper levitation coil 6 or the lower levitation coil 6'; so as to make the superconducting rotor 5 return to the central balance position. A detector (not shown) is used for determining a change of gravity according to the operating current.

Based on the low-temperature superconducting device for measuring gravity according to above embodiment of the present disclosure, the whole low-temperature superconducting device is cooled by the cryocooler 2, the intermediate electrode 8 surrounding the magnetic shielding chamber 11 generates a voltage when the superconducting rotor 5 is displaced due to a change of gravity, and the superconducting quantum interference device 14 adjusts the operating current of the upper levitation coil 6 or the lower levitation coil 6' in accordance with the voltage to make the superconducting rotor 5 return to the central balance position. A change of gravity may be determined according to an operating current fed back to the upper levitation coil 6 or the lower levitation coil 6'. Thus, unlike the conventional superconducting device for measuring gravity, the superconducting device according to the present disclosure can be operated independently for a long term, and can be used in various field environments.

Wherein, the directions of forces produced by the upper levitation coil 6 and the lower levitation coil 6' on the surface of the superconducting rotor 5 all point to the center of the superconducting rotor 5, thus the direction of resultant force of magnetic field forces generated by the levitation coils is in a direction along the polar axis of the superconducting rotor 5, i.e., a vertical direction. When the superconducting rotor 5 is levitated, the difference between the magnetic field force generated by the lower levitation coil 6' positioned at the lower portion of superconducting rotor 5 and the magnetic field force generated by the upper levitation coil 6 at the upper portion of the superconducting rotor 5 is equal to the gravity value of the superconducting rotor 5. When the superconducting rotor 5 is levitated in the magnetic shielding chamber 11, in a case of keeping a gravitational field on the earth's surface unchanged, the superconducting rotor 5 moves upwards by a displacement if the current of the lower levitation coil 6' is increased, and the superconducting rotor 5 moves downwards by a displacement if the current of the upper levitation coil 6 is increased. Similarly, in a case of keeping currents of the levitation coils unchanged, the superconducting rotor 5 moves upwards by a displacement if the gravitational field decreases and moves downwards by a displacement if the gravitational field increases. Both of the upper levitation coil 6 and the lower levitation coil 6' are powered by program-controlled direct current power supplies.

The upper electrode 7, the intermediate electrode 8 and the lower electrode 9 form three electrodes for measuring changes of levitation displacement of the superconducting rotor 5. A first capacitor comprises the upper electrode 7 and the intermediate electrode 8, and a second capacitor comprises the lower electrode 9 and the intermediate electrode 8. When the superconducting rotor 5 is levitated at the central balance position of the magnetic shielding chamber 11, a first capacitance between the intermediate electrode 8 and the upper electrode 7 is equal to a second capacitance between the intermediate electrode 8 and the lower electrode 9, and thus a voltage of zero is outputted from the intermediate electrode 8, so that the electrical bridge is balanced. When the gravitational field on the earth's surface changes, the superconducting rotor 5 moves upwards or downwards from the central position by a certain distance, at this time, the first capacitance is not equal to the second capacitance, and thus a voltage is outputted from the intermediate electrode 8, the polarity of the output voltage depends on the displacement direction of the superconducting rotor 5. For example, it is possible to assume that the voltage is positive when the superconducting rotor 5 moves upwards from the central position and is negative when the superconducting rotor 5 moves downwards from the central position.

Figure 3:
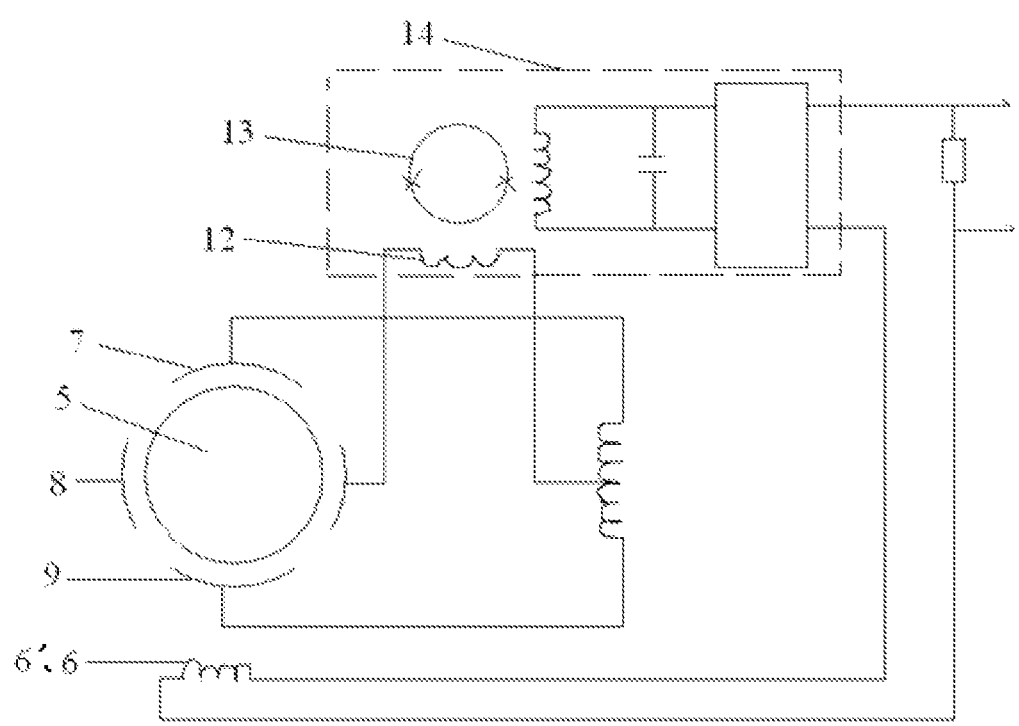
FIG. 3 is a schematic diagram of one embodiment of a superconducting rotor position detection feedback circuit of the present disclosure.

FIG. 3 is a schematic diagram of an embodiment of a superconducting rotor position detection feedback circuit of the present disclosure. As shown in FIG. 3, the outputs of the intermediate electrode 8 are connected to two ends of an input coil 12 of the superconducting quantum interference device 14, and thus a current flow through the input coil 12. The input coil 12 is coupled to a superconducting ring 13 of the superconducting quantum interference device 14; so that the superconducting quantum interference device 14 can produce a corresponding output voltage.

The superconducting quantum interference device 14 is in a cylindrical shape and is disposed on the outer sidewall of the rotor chamber 4. The superconducting quantum interference device 14 can measure an extremely weak magnetic field according to the Josephson Effect in superconductive physics with a sensitivity of several orders of magnitude higher than that of regular gravity measuring devices. A film of a superconducting metal material with the Meissner effect, preferably, a niobium film, is coated on the outer surface of the superconducting quantum interference device 14 to suppress any effect of the external interference magnetic field on measuring accuracy. The superconducting quantum interference device 14 comprises the input coil 12 and the superconducting ring 13. The intermediate electrode 8 may be considered as a detection coil which applies an output voltage to be detected to the two ends of the input coil 12. The input coil 12 is coupled to the superconducting ring 13 to input a signal to be detected into the superconducting ring 13. The magnitude of an output voltage signal is obtained from the superconducting ring 13 by using phase-locking amplification technology, and the output voltage signal is converted to a feedback current by a circuit and is provided to the upper levitation coil 6 or the lower levitation coil 6'. In this manner, an operating current of the upper levitation coil 6 or the lower levitation coil 6' can be adjusted.

The superconducting quantum interference device 14 further comprises a processing circuit for adjusting the operating currents of the upper levitation coil 6 or the lower levitation coil 6'.

Wherein, when the superconducting rotor 5 moves upwards from the central balance position, the superconducting quantum interference device 14 increases the operating current of the upper levitation coil 6 or decreases the operating current of the lower levitation coil 6' according to a current generated from the output voltage of the intermediate electrode 8, so as to make the superconducting rotor 5 return to the central balance position.

When the superconducting rotor 5 moves downwards from the central balance position, the superconducting quantum interference device 14 decreases the operating current of the upper levitation coil 6 or increases the operating current of the lower levitation coil 6' according to a current generated from the output voltage of the intermediate electrode 8, so as to make the superconducting rotor 5 return to the central balance position.

The method for measuring gravity according to the present disclosure comprises: the superconducting rotor 5 is levitated at a central balance position in the magnetic shielding chamber 11 by means of magnetic levitation forces generated by powering the upper levitation coil 6 and the lower levitation coil 6', at this time the resultant force of the magnetic levitation forces applied on the superconducting rotor 5 is equal to the gravity of the superconducting rotor 5; when the superconducting rotor 5 is displaced due to a change of gravity, the intermediate electrode 8 generates an output voltage and thus generates a current which flows through the input coil 12 of the superconducting quantum interference device 14, the input coil 12 is coupled to the superconducting ring 13 of the superconducting quantum interference device 14, so that the superconducting quantum interference device 14 outputs a corresponding voltage and provides a feedback current to the upper levitation coil 6 or the lower levitation coil 6', a magnetic force generated from the feedback current returns the superconducting rotor 5 to the central balance position; the relationship between the feedback current and the levitation force of the superconducting rotor 5 is calibrated, thereby the value of a levitation force of the superconducting rotor 5 can be obtained by measuring the feedback current, and a change value of gravity can be obtained consequently.

As to the calibration of the feedback current and the levitation force of the superconducting rotor 5, a levitation force-levitation current analysis model can be established by using Finite Element Method. Further a relationship between the levitation current and the levitation force when the superconducting rotor 5 is levitated at different positions with small displacements from the central position is calculated, according to the fact that the levitation force applied on the superconducting rotor 5 when being levitated at the levitation central position is equal to the gravity of the superconducting rotor 5 and the corresponding magnitude of the levitation coil current in experiments. Consequently, a relationship between a feedback current making the superconducting rotor 5 return to the levitation central position and the levitation force is obtained. The device measures a change of the levitation position of the superconducting rotor 5 by calibrating the relationship between the output voltage of the intermediate electrode 8 and the levitation displacement of the superconducting rotor 5. Thus, a change of gravity can be obtained based on the operating current provided to the upper levitation coil 6 or the lower levitation coil 6' from the superconducting quantum interference device 14.

It should be noted that, because those skilled in the art may understand the particular working principle of the superconducting quantum interference device 14, the processing of superconducting quantum interference device 14 will not be particularly described in detail herein.

Preferably, the low-temperature superconducting device further comprises an anti-radiation barrel 3 and pull rods 10, wherein: in the low-temperature container 1, the anti-radiation barrel 3 is fixed at the lower portion of the primary coldhead of the cryocooler 2 by means of the pull rods 10, and the rotor chamber 4 is located in the anti-radiation barrel 3.

Wherein, the cooling temperature of primary coldhead of the cryocooler may be about 30K. Through setting the anti-radiation barrel 3 outside the rotor chamber 4, external radiation transmitted into the rotor chamber 4 may be further reduced.

Preferably, the superconducting rotor 5 and the magnetic shielding chamber 11 are composed by a superconducting metal material, such as a niobium material.

Preferably, the rotor chamber 4 is a cylindrical cavity made of a metal with good thermal conductivity, such as high purity copper. The magnetic shielding chamber 11 has a cylindrical external surface and an internal spherical cavity. All of the upper electrode 7, the intermediate electrode 8, and the lower electrode 9 are made of a metal material with good electrical conductivity, such a titanium material.

Preferably, the low-temperature container 1 further comprises a horizontal adjustor (not shown) for ensuring that the polar axis of the superconducting rotor 5 is perpendicular to the horizontal plane, so as to improve the accuracy of the device.

It will be apparent to those skilled in the art that various modifications to the preferred embodiments of the disclosure as described herein can be made without departing from the spirit or scope of the disclosure as defined in the appended claims. Thus, the disclosure covers the modifications and variations, provided they come within the scope of the appended claims and the equivalents thereto.

What is claimed is:

1. A low-temperature superconducting device for measuring gravity, comprising a low-temperature container, a cryocooler, a rotor chamber, a superconducting rotor, an upper levitation coil, a lower levitation coil, an upper electrode, an intermediate electrode, a lower electrode, a magnetic shielding chamber, a superconducting quantum interference device and a detector, wherein:
   said cryocooler is positioned at an upper portion of said low-temperature container;
   said rotor chamber disposed in said low-temperature container is fixed under a secondary coldhead of said cryocooler;
   said upper levitation coil is disposed at an upper portion of said rotor chamber, and said lower levitation coil is disposed at a lower portion of said rotor chamber;
   said magnetic shielding chamber is disposed in a center of said rotor chamber, and a spherical cavity is formed in an interior of said magnetic shielding chamber;
   said superconducting rotor is levitated at a central balance position of said spherical cavity by a magnetic force generated by said upper levitation coil and said lower levitation coil;
   said upper electrode is disposed in the central position of an upper portion of the body of said magnetic shielding chamber;
   said lower electrode is disposed in the central position of a lower portion of the body of said magnetic shielding chamber;
   said intermediate electrode with an annular shape is disposed along a sidewall of said magnetic shielding chamber and said intermediate electrode is along a periphery of a horizontal plane passing the center of said spherical cavity, and inner-oriented surfaces of the body of said magnetic shielding chamber, said upper electrode, said intermediate electrode and said lower electrode comprise a complete spherical cavity;
   said superconducting quantum interference device is disposed on an outer sidewall of said rotor chamber;
   said intermediate electrode outputs a voltage when said superconducting rotor deviates from said central balance position, said superconducting quantum interference device adjusts operating current of said upper levitation coil or said lower levitation coil to make said superconducting rotor return to said central balance position according to a current generated by said voltage outputted from said intermediate electrode;
   said detector is used for determining a change of gravity according to said operating current.

2. The low-temperature superconducting device according to claim 1, further comprising an anti-radiation barrel and pull rods, wherein:

in said low-temperature container, said anti-radiation barrel is fixed at a lower portion of a primary coldhead of said cryocooler by said pull rods; and said rotor chamber is located in said anti-radiation barrel.

3. The low-temperature superconducting device according to claim 1, wherein:

insulating layers are disposed between said magnetic shielding chamber and each of said upper electrode, said intermediate electrode and said lower electrode.

4. The low-temperature superconducting device according to claim 1, wherein:

said superconducting rotor and said magnetic shielding chamber comprise a superconducting metal material with a Meissner effect.

5. The low-temperature superconducting device according to claim 1, wherein:

a film of a superconducting metal material with a Meissner effect is coated on an external surface of said superconducting quantum interference device (14).

6. The low-temperature superconducting device according to claim 1, wherein:

in a case that said superconducting rotor moves upwards from said central balance position, said superconducting quantum interference device increases the operating current of said upper levitation coil or decreases the operating current of said lower levitation coil according to the current generated by the voltage outputted from said intermediate electrode, then make said superconducting rotor return to said central balance position.

7. The low-temperature superconducting device according to claim 1, wherein: in a case that said superconducting rotor moves downwards from said central balance position, said superconducting quantum interference device decreases the operating current of said upper levitation coil or increases the operating current of said lower levitation coil according to the current generated by the voltage outputted from said intermediate electrode, then make said superconducting rotor return to said central balance position.

8. The low-temperature superconducting device according to claim 1, wherein:

said low-temperature container further comprises a horizontal adjustor for ensuring that a polar axis of said superconducting rotor is perpendicular to the horizontal plane.

* * * * *